(12) United States Patent
Kayes et al.

(10) Patent No.: US 12,424,965 B2
(45) Date of Patent: Sep. 23, 2025

(54) LAYERED WINDOW IN THERMOPHOTOVOLTAIC DEVICES

(71) Applicants: Antora Energy, Inc., Sunnyvale, CA (US); ALLIANCE FOR SUSTAINABLE ENERGY, LLC, Golden, CO (US); Arizona Board of Regents on behalf of Arizona State University, Scottsdale, AZ (US)

(72) Inventors: Brendan M. Kayes, Los Gatos, CA (US); Leah Y. Kuritzky, Berkeley, CA (US); Emmett E. Perl, Santa Clara, CA (US); Tarun C. Narayan, Riverside, CA (US); Justin A. Briggs, Woodside, CA (US); Myles Aaron Steiner, Denver, CO (US); Eric James Tervo, Lakewood, CO (US); Madhan Kumar Arulanandam, Tempe, AZ (US); Richard R. King, Tempe, AZ (US)

(73) Assignees: Antora Energy, Inc., Sunnyvale, CA (US); Alliance for Sustainable Energy, LLC, Golden, CO (US); Arizona Board of Regents on behalf of Arizona State University, Scottsdale, AZ (US)

( * ) Notice: Subject to any disclaimer, the term of this patent is extended or adjusted under 35 U.S.C. 154(b) by 118 days.

(21) Appl. No.: 18/328,454

(22) Filed: Jun. 2, 2023

(65) Prior Publication Data

US 2023/0396206 A1 Dec. 7, 2023

Related U.S. Application Data

(60) Provisional application No. 63/348,132, filed on Jun. 2, 2022.

(51) Int. Cl.
*H02S 10/30* (2014.01)
*H10F 77/124* (2025.01)

(52) U.S. Cl.
CPC ......... *H02S 10/30* (2014.12); *H10F 77/1248* (2025.01)

(58) Field of Classification Search
None
See application file for complete search history.

(56) References Cited

U.S. PATENT DOCUMENTS

| 4,017,332 A | 4/1977 | James |
| 4,846,931 A | 7/1989 | Gmitter et al. |

(Continued)

FOREIGN PATENT DOCUMENTS

| CN | 101383571 A | 3/2009 |
| EP | 3467879 A1 | 4/2019 |

(Continued)

OTHER PUBLICATIONS

Lee et al. "Multiple growths of epitaxial lift-off solar cells from a single InP substrate", Applied Physics Letters 97,101107 (2010), Published Sep. 8, 2010, pp. 4.

(Continued)

*Primary Examiner* — Eli S Mekhlin
(74) *Attorney, Agent, or Firm* — Fredrikson & Byron, P.A.

(57) ABSTRACT

A layered window in thermophotovoltaic (TPV) devices is disclosed herein. The device may include two or more front window layers, including an outer front window layer nearest the light source that is thin and highly doped and a lower doped inner front window layer nearest a TPV absorber layer. In some embodiments, there may be additional front window layers between the outer front window layer and the inner front window layer. In some embodiments, the TPV (Continued)

device also may include a front contact, a back contact, and other components.

23 Claims, 4 Drawing Sheets

(56) References Cited

U.S. PATENT DOCUMENTS

| | | | |
|---|---|---|---|
| 5,221,854 A | | 6/1993 | Banerjee et al. |
| 5,726,462 A | | 3/1998 | Spahn et al. |
| 10,615,304 B2 | | 4/2020 | Kayes et al. |
| 2004/0245543 A1 | | 12/2004 | Yoo |
| 2009/0078310 A1 | * | 3/2009 | Stan ............... H10F 10/144 |
| | | | 136/262 |
| 2010/0031994 A1 | | 2/2010 | Varghese |
| 2011/0186910 A1 | | 8/2011 | Forrest et al. |
| 2013/0037095 A1 | | 2/2013 | Forrest et al. |
| 2017/0069491 A1 | | 3/2017 | Cheng et al. |
| 2019/0109261 A1 | | 4/2019 | Kayes et al. |
| 2019/0386170 A1 | | 12/2019 | Jain et al. |
| 2020/0007069 A1 | | 1/2020 | Lenert et al. |
| 2020/0119222 A1 | | 4/2020 | Jain et al. |
| 2020/0365755 A1 | | 11/2020 | Ritenour et al. |
| 2022/0059294 A1 | | 2/2022 | Wang et al. |

FOREIGN PATENT DOCUMENTS

| | | | | |
|---|---|---|---|---|
| WO | WO-2010048537 A2 | * | 4/2010 | ..... H01L 31/022441 |
| WO | 2011150290 A2 | | 12/2011 | |
| WO | 2019023282 A1 | | 1/2019 | |
| WO | 2020180785 A1 | | 9/2020 | |

OTHER PUBLICATIONS

Youtsey et al. "Epitaxial Lift-Off of Large-Area GaAs Thin-Film Multi-Junction Solar Cells", CS Mantech Conference, Apr. 23-26, 2012, pp. 5.

Ehrhardt et al. "Fabrication of contact holes by rear side laser ablation of polyimide foils for CIGS solar modules" Applied Surface Science 278 (2013), Published online Jan. 16, 2013, pp. 219-222.

Chancerel et al. "InGaAs Subcell Epitaxial Lift-Off Combined with InP Wafer Recycling" , 14th International Conference on Concentrator Photovoltic Systems CPV'14, Published Apr. 16, 2018, Excerpt pp. 1.

Hudat et al., "High-Performance In0.53GA.047As Thermophotovoltaic Devices Grown by Solid Source Molecular Beam Epitaxy", IEEE Electron Device Letters, vol. 23, No. 12, Dec. 2002, pp. 697-699.

Wilt et al., "Monolithic interconnected modules (MIMs) for thermophotovoltaic energy conversion", Semiconductor Science and Technology, Published Apr. 4, 2003, pp. S209-S215.

Datas et al., "Monolithic interconnected modules (MIM) for high irradiance photovoltaic energy conversion: A comprehensive review", Renewable and Sustainable Energy Reviews 73, Published online Feb. 1, 2017, pp. 477-495.

* cited by examiner

LAYERED WINDOW IN THERMOPHOTOVOLTAIC DEVICES

RELATED APPLICATIONS

This application claims the benefit of U.S. Provisional Application No. 63/348,132, filed Jun. 2, 2022, the contents of which are incorporated herein by reference in their entirety.

This invention was made with United States government support under Contract No. DE-AC36-08GO28308 awarded by the U.S. Department of Energy. The United States government has certain rights in this invention.

BACKGROUND OF INVENTION

III/V photovoltaic (PV) and thermophotovoltaic (TPV) devices are typically grown with a front window meant to reduce recombination of the carriers in the absorber layers of the PV and TPV devices. Typically, the desire is for the front window to be as thin as possible, as much of the incident light absorbed in that layer does not generate carriers that can be collected, thus not generating useful electrical power, but rather just existing as a loss mechanism. Thus, the typical trend is to increase the doping in the front window layer to enable a thinner front window. Silicon typically has a doping limit around $5\times10^{18}$ cm$^{-3}$ in phosphides such as InP, AlInGaP, and AlInP. Te, Se, and S dopants may allow for higher doping concentrations ($>1\times10^{19}$ cm$^{-3}$). However, having a very highly doped front window may degrade the absorber quality and/or the quality of the passivation provided to the absorber by the front window.

SUMMARY

For at least reasons similar to those above, a window in TPV devices having multiple layers is desirable. Some aspects of this disclosure are directed to thermophotovoltaic devices having a thermophotovoltaic absorber and a front window. In some examples, the thermophotovoltaic absorber has a first side configured to receive electromagnetic radiation radiated from a thermal source and generate electricity from the received electromagnetic radiation. The front window can be positioned on the first side of the thermophotovoltaic absorber such that electromagnetic radiation travels through the front window before reaching the first side of the thermophotovoltaic absorber. The front window can include an outer front window layer and an inner front window layer, wherein the inner front window layer is positioned between the outer front window layer and the first side of the thermophotovoltaic absorber. In some examples, devices can include an intermediate front window layer positioned between the outer front window layer and the inner front window layer.

In some examples, the outer front window layer has the same or a larger bandgap compared to the inner front window layer. In some examples, the outer front window layer is doped to the same or a higher level compared to the inner front window layer. In some embodiments, the thermophotovoltaic absorber comprises a III/V semiconductor material. Additionally or alternatively, in some embodiments, the inner front window layer comprises a III/V semiconductor material, and in some embodiments, the outer front window layer comprises a III/V semiconductor material. In some embodiments, the thermophotovoltaic absorber comprises a material having a bandgap of less than 1 eV, and in some such examples, the outer front window layer comprises a material having a bandgap of greater than 1 eV.

Some aspects of this disclosure are directed toward methods of making a thermophotovoltaic device. In some examples, methods include depositing an outer front window layer, depositing an inner front window layer, and depositing a thermophotovoltaic absorber on the inner front window layer. In some examples, depositing the inner front window layer comprises depositing the inner front window layer onto the outer front window layer.

In some examples, the thermophotovoltaic absorber contacts the inner front window layer and the inner front window layer is positioned between the thermophotovoltaic absorber and the outer front window layer. The thermophotovoltaic absorber can be configured to receive electromagnetic radiation radiated from a thermal source and generate electricity from the received electromagnetic radiation.

BRIEF DESCRIPTION OF THE DRAWINGS

Various non-limiting and non-exhaustive aspects and features of the present disclosure are described hereinbelow with references to the drawings, wherein.

Like reference numbers and designations in the various drawings indicate like elements. Skilled artisans will appreciate that elements in the Figures are illustrated for simplicity and clarity, and have not necessarily been drawn to scale, for example, with the dimensions of some of the elements in the figures exaggerated relative to other elements to help to improve understanding of various embodiments. Common, well-understood elements that are useful or necessary in a commercially feasible embodiment are often not depicted in order to facilitate a less obstructed view of these various embodiments.

DETAILED DESCRIPTION

The invention is directed to a layered front window in a thermophotovoltaic (TPV) cell. The Figures and the following description describe certain embodiments by way of illustration only. One of ordinary skill in the art will readily recognize from the following description that alternative embodiments of the structures and methods illustrated herein may be employed without departing from the principles described herein. Reference will now be made in detail to several embodiments, examples of which are illustrated in the accompanying figures.

The systems and methods described herein disclose a TPV device that includes a layered window including a thin, highly-doped layer on the side of the front window nearest the light source, referred to herein as an outer front window layer, and a lower-doped layer between said outer front window layer and the absorber, referred to herein as an inner front window layer. Such layered front window may be implemented in a III/V TPV cell application. In some examples, the outer front window layer may be highly doped at concentrations of greater than $1\times10^{19}$ cm$^{-3}$.

Figure 1:
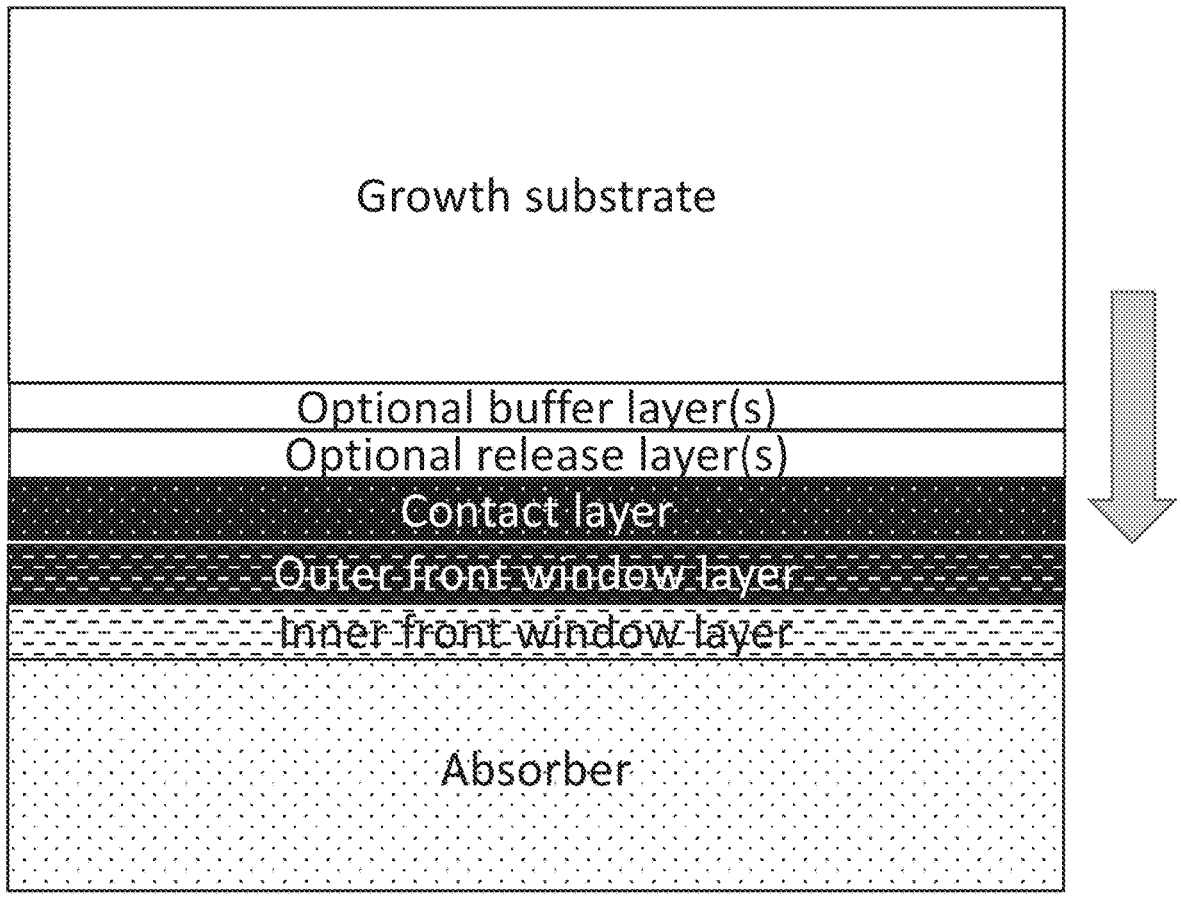
FIG. 1 is a diagram showing epitaxial layer growth in a thermophotovoltaic device, in accordance with one or more embodiments.

FIG. 1 is a diagram showing epitaxial layer growth in a thermophotovoltaic device, in accordance with one or more embodiments. The arrow indicates the direction of grown on the growth substrate, beginning with an optional buffer layer and an optional release layer, through to an absorber layer (e.g., GaAs absorber, InGaAs absorber, GaSb absorber). Other layers in between may include a contact layer, an outer front window layer upon, and an inner front window layer. In some examples, additional front window layers may be grown between the outer front window layer and the inner front window layer.

In a GaAs absorber example, an inner front window layer could be InGaP or AlGaAs with Si, Te, Se, or S doping, with dopant concentration in the range $5\times10^{16}$ cm$^{-3}$ to $5\times10^{18}$ cm$^{-3}$. An outer front window layer could be AlInP or AlInGaP or InGaP or AlGaAs with Si, Te, Se, or S doping, with dopant concentration in the range $2.5\times10^{18}$ cm$^{-3}$ to $5\times10^{19}$ cm$^{-3}$.

In an InGaAs absorber example, an inner front window layer could be InP or GaAsSb or InGaAsP with Si, Te, Se, or S doping, with dopant concentration in the range $5\times10^{16}$ cm$^{-3}$ to $5\times10^{18}$ cm$^{-3}$. An outer front window layer could be InP with Si, Te, Se, or S doping, with dopant concentration in the range $2.5\times10^{18}$ cm$^{-3}$ to $5\times10^{19}$ cm$^{-3}$.

In a GaSb absorber example, an inner front window layer could be AlGaSb or AlAsSb with Si, Te, Se, or S doping, with dopant concentration in the range $5\times10^{16}$ cm$^{-3}$ to $5\times10^{18}$ cm$^{-3}$. An outer front window layer could be AlGaSb or AlAsSb with Si, Te, Se, or S doping, with dopant concentration in the range $2.5\times10^{18}$ cm$^{-3}$ to $5\times10^{19}$ cm$^{-3}$.

Figure 2:
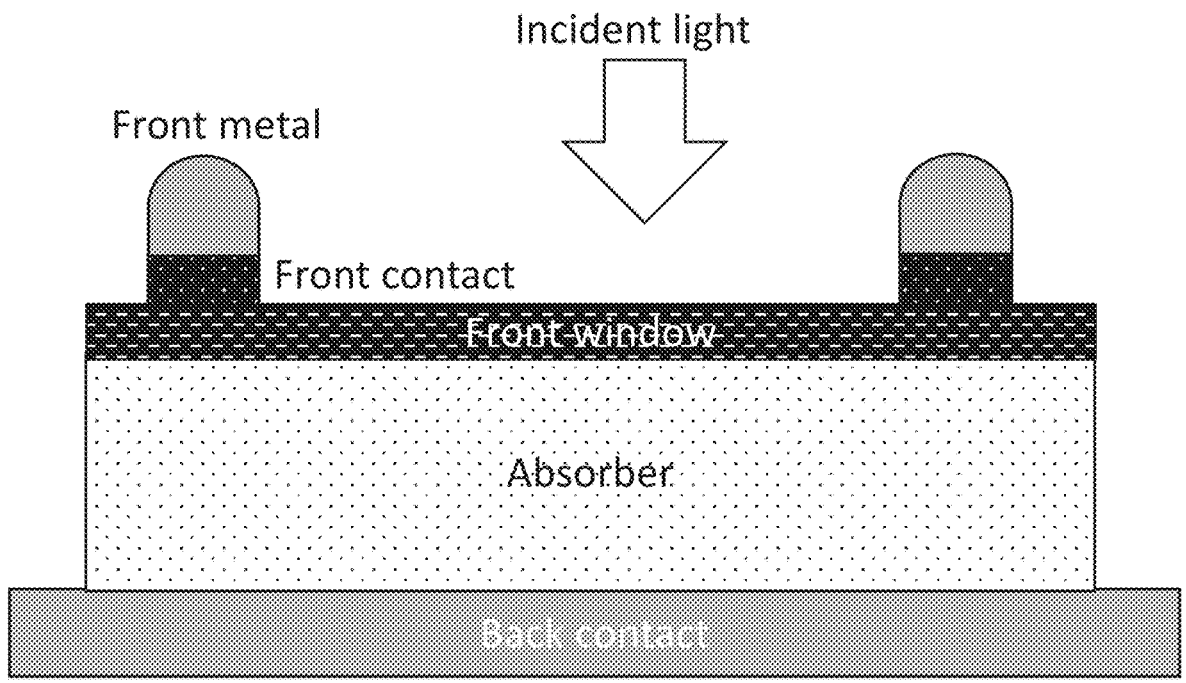
FIG. 2 is a cross-sectional view of a prior art thermophotovoltaic device having a single layer front window.

FIG. 2 is a cross-sectional view of a prior art thermophotovoltaic (TPV) device having a single layer front window. This prior art TPV device includes a front metal, front contact, absorber, back contact, and a single layer front window configured to receive incident light.

Figure 3:
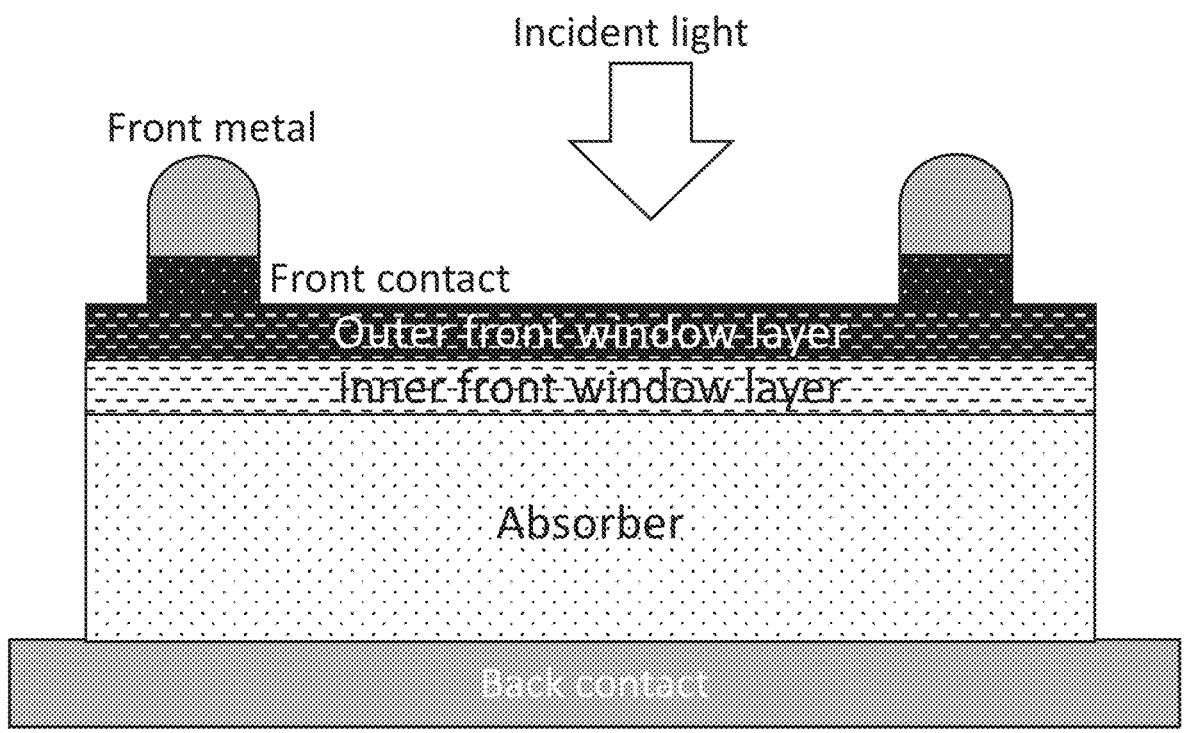
FIG. 3 is a cross sectional view of a thermophotovoltaic device, in accordance with one or more embodiments.

FIG. 3 is a cross sectional view of a thermophotovoltaic (TPV) device, in accordance with one or more embodiments. This exemplary TPV device includes a front metal, front contact, absorber layer, and back contact as in FIG. 2A. This exemplary TPV device includes a front window comprising an outer front window layer closest to the incident light and an inner front window layer between the outer front window layer and the absorber layer. The outer front window layer may comprise a thin, highly doped front window as described herein. The inner front window layer may comprise a lower doped front window layer as described herein.

Figure 4:
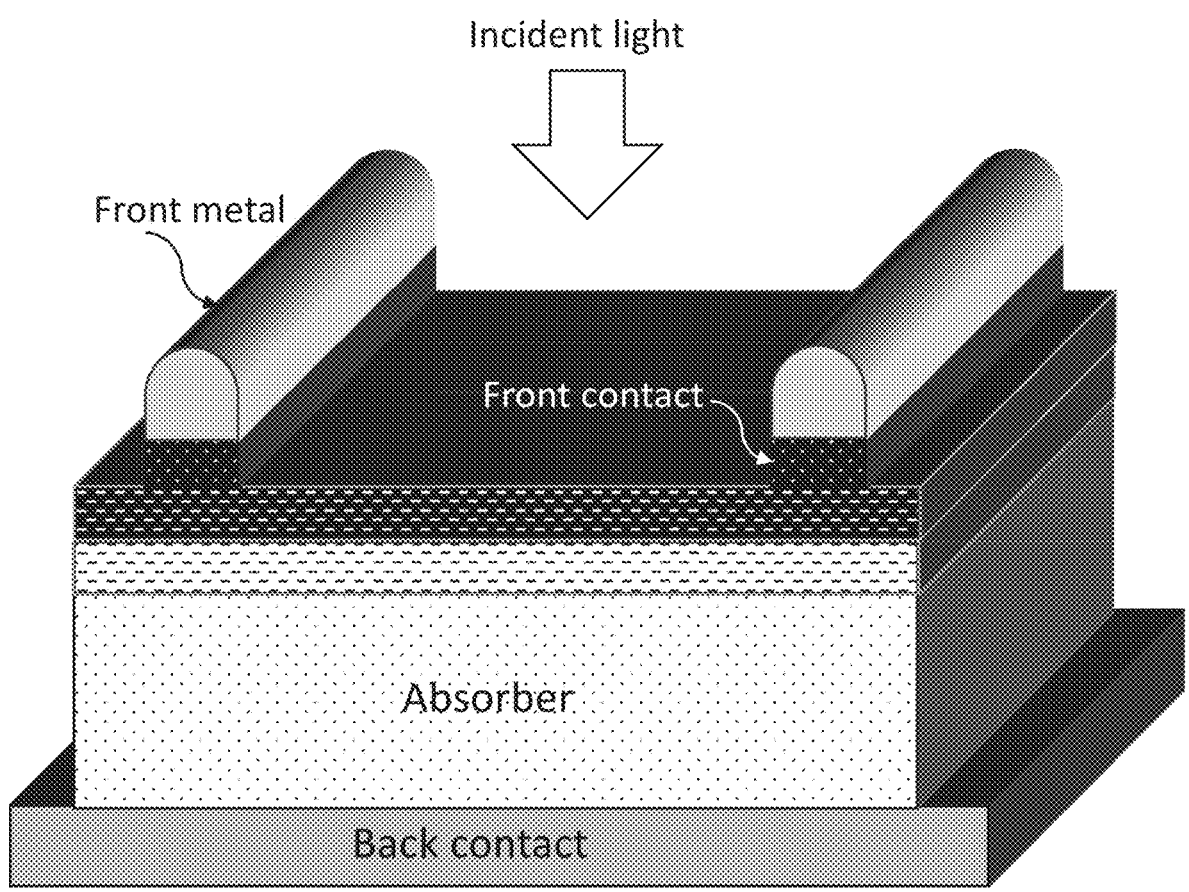
FIG. 4 is a perspective view of a thermophotovoltaic device, in accordance with one or more embodiments.

FIG. 4 is a perspective view of a thermophotovoltaic device, in accordance with one or more embodiments. Similar to FIG. 3, this exemplary TPV device includes a front metal, front contact, absorber layer, back contact, and a front window comprising an outer front window layer closest to the incident light source and an inner front window layer between the outer front window layer and the absorber layer. The outer front window layer may comprise a thin, highly doped front window as described herein. The inner front window layer may comprise a lower doped front window layer as described herein.

Figure 5:
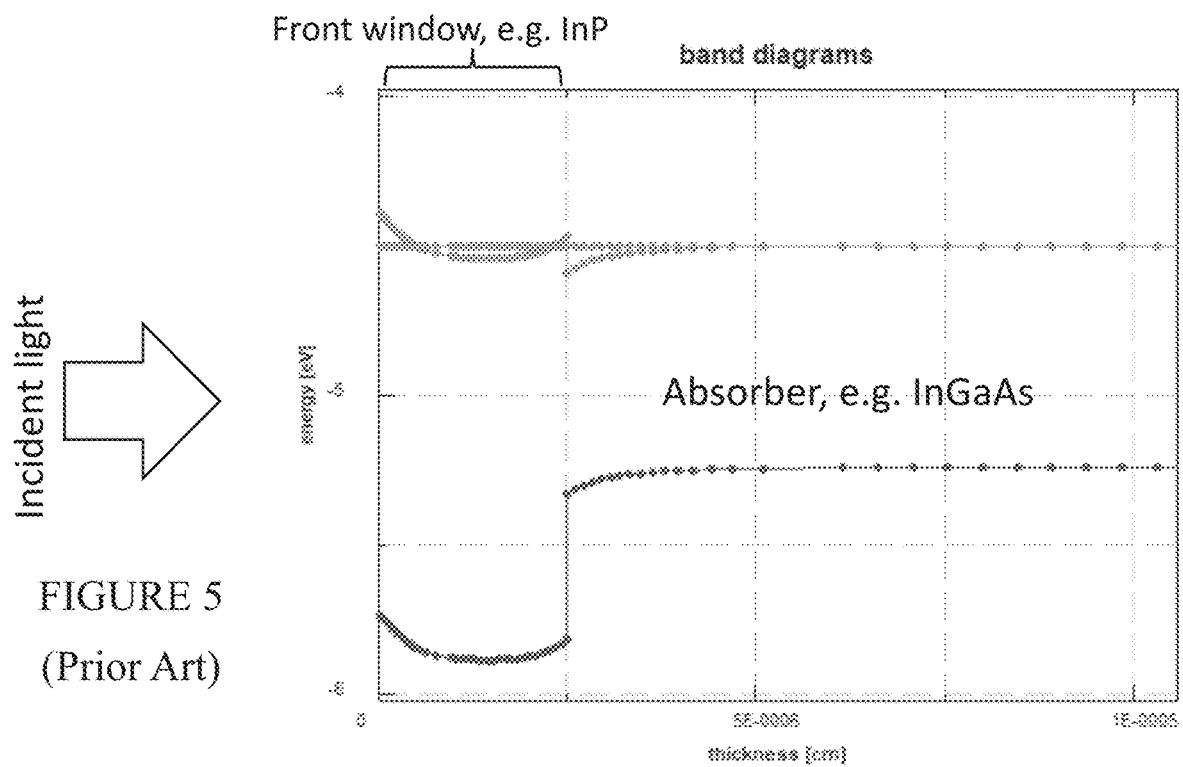
FIG. 5 is a band diagram showing energy levels for layers of a prior art thermophotovoltaic device.

FIG. 5 is a band diagram showing energy levels for layers of a prior art thermophotovoltaic device. As shown, the initial curvature in the band diagram represents the single layer front window configured to receive the incident light and directly adjacent to the absorber layer.

Figure 6:
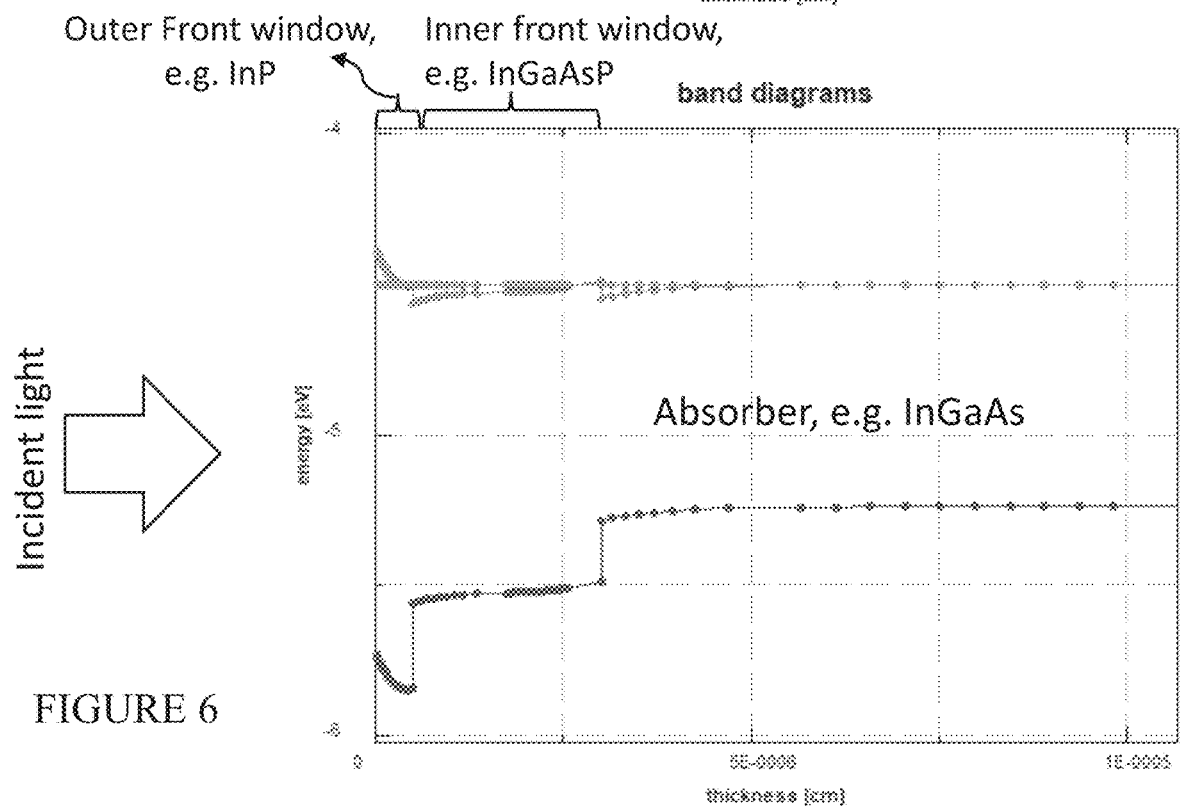
FIG. 6 is a band diagram showing energy levels for layers of a thermophotovoltaic device, in accordance with one or more embodiments.

FIG. 6 is a band diagram showing energy levels for layers of a thermophotovoltaic device, in accordance with one or more embodiments. As shown, there is a much smaller (e.g., thinner) curvature in the band diagram representing the outer front window layer of a front window comprising multiple front window layers. There is a more even energy level distribution for the inner front window layer with a smaller energy gap between the inner front window layer and the absorber layer than shown in FIG. 3A. In some examples, the outer front window layer may have the same or larger bandgap than the inner front window layer. In some examples, the outer front window layer may have the same or higher doping than the inner front window layer. In some examples, there may be additional front window layers, as small steps in conduction band energy between adjacent layers may aid majority carrier extraction.

In an example embodiment, a thermophotovoltaic device comprises an outer front window layer comprising a material having a first conduction band energy level and a first valence band energy level, an inner front window layer comprising a material having a second conduction band energy level and a second valence band energy level, and a thermophotovoltaic absorber comprising a material having a third conduction band energy level and a third valence band energy level. In some such examples, the first conduction band energy level is greater than the second conduction band energy level, the second conduction band energy level is greater than the third conduction band energy level. Additionally or alternatively, in some such examples, the first valence band energy level is less than the second valence band energy level, and the second valence band energy level is less than the third valence band energy level. In some embodiments, such conduction band and/or valence band energy levels can be used to provide a carrier-selective contact configuration.

The concept of "thermal energy" or "thermal voltage" can be useful to describe a potential barrier that a mobile carrier can overcome. In some examples, the thermal energy can be defined as the Boltzmann constant multiplied by the temperature in Kelvin (sometimes referred to as $k_BT$). At "room temperature" (e.g., 25° C., or 298.15 K), this thermal energy is approximately 25.69 meV. In the absence of band-bending effects (which can result, for example, from heavy doping), in some cases, a potential barrier of greater than 3 $k_BT$ (approximately 77 meV at room temperature) is unlikely to be overcome by a mobile carrier, whereas a potential barrier smaller than that is more likely to be overcome. Thus, in some such cases, a potential barrier of greater than 3 $k_BT$ is considered to generally block carrier transport and a potential barrier of less than 3 $k_BT$ is considered to not generally block carrier transport. However, in some such examples, even if a barrier of greater than 3 $k_BT$ blocks most carrier transport, some carriers may still overcome such a barrier. Additionally or alternatively, in some such examples, even if a barrier of less than 3 $k_BT$ generally does not block carrier transport, some carriers may still be blocked by such a barrier. Further, in some cases, in the presence of band bending, for example, caused by heavy doping on one or both sides of an interface, carriers may be able to tunnel through a potential barrier of larger than 3 $k_BT$.

In some embodiments having a thermophotovoltaic absorber with n-type doping, a combination of a relatively small (e.g., less than 77 meV) differences between the first conduction band energy level and the second conduction band energy level, and between the second conduction band energy level and the third conduction band energy level, and a high doping level (e.g., greater than $1\times10^{18}$ cm$^{-3}$) in the inner front window layer and the outer front window layer having n-type doping, allows for efficient transport of majority carriers (electrons) between and through the conduction bands of the outer front window layer, the inner front window layer, and the thermophotovoltaic absorber. Similarly, in some such embodiments, a combination of relatively large (e.g., greater than 77 meV) differences between valence band energy levels in at least one of the pairs of adjacent layers (e.g., the first valence band energy level and the second valence band energy level and/or the second valence band energy level and the third valence band energy level) substantially blocks the transport of minority carriers (holes) between and through the valence bands of the outer front window layer, the inner front window layer, and the thermophotovoltaic absorber. This can create an electron-selective contact which allows electrons to move between and through the conduction bands of the outer front window layer, the inner front window layer, and the thermophotovoltaic absorber more freely than holes move between and through the valence bands of the outer front window layer, the inner front window layer, and the thermophotovoltaic absorber to form an electron-selective contact.

Similarly, in some embodiments having a thermophotovoltaic absorber with p-type doping, a combination of a relatively small (e.g., less than 77 meV) differences between the first valence band energy level and the second valence band energy level, and between the second valence band energy level and the third valence band energy level, and a high doping level (e.g., greater than $1\times10^{18}$ cm$^{-3}$) in the inner front window layer and the outer front window layer having p-type doping, allows for efficient transport of majority carriers (holes) between and through the valence bands of the outer front window layer, the inner front window layer, and the thermophotovoltaic absorber. Similarly, in some such embodiments, a combination of relatively large (e.g., greater than 77 meV) differences between conduction band energy levels in at least one of the pairs of adjacent layers (e.g., the first conduction band energy level and the second conduction band energy level and/or the second conduction band energy level and the third conduction band energy level) substantially blocks the transport of minority carriers (electrons) between and through the conduction bands of the outer front window layer, the inner front window layer, and the thermophotovoltaic absorber. This can create a hole-selective contact which allows holes to move between and through the valence bands of the outer front window layer, the inner front window layer, and the thermophotovoltaic absorber more freely than electrons move between and through the conduction bands of the outer front window layer, the inner front window layer, and the thermophotovoltaic absorber.

While some examples described above reference band energy level differences greater than or less than 77 meV to block or permit carrier transport, other band energy level differences can be used. For example, temperature, doping, intermixing of adjacent layers, quantum mechanical tunneling, and/or other effects may make a barrier larger than 77 meV still able to support carrier transport, or a barrier smaller than 77 meV able to block carrier transport. In some examples, such as described elsewhere herein, energy level differences to generally block or permit carrier transport can be provided in relation to a temperature, such as barriers above or below $3\,k_BT$ to generally block or permit carrier transport, respectively. Thus, in various embodiments, different band energy level barriers can be chosen to selectively permit or block carrier transport.

To facilitate an understanding of the subject matter described herein, many aspects are described in terms of sequences of actions. The description herein of any sequence of actions is not intended to imply that the specific order described for performing that sequence must be followed. All methods described herein may be performed in any suitable order unless otherwise indicated herein or otherwise clearly contradicted by context.

The use of the terms "a" and "an" and "the" and similar references in the context of describing the subject matter (particularly in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. Furthermore, the foregoing description is for the purpose of illustration only, and not for the purpose of limitation, as the scope of protection sought is defined by the claims as set forth hereinafter together with any equivalents thereof. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

While specific examples have been provided above, it is understood that the present invention can be applied with a wide variety of inputs, thresholds, ranges, and other factors, depending on the application. For example, the time frames and ranges provided above are illustrative, but one of ordinary skill in the art would understand that these time frames and ranges may be varied or even be dynamic and variable, depending on the implementation.

As those skilled in the art will understand, a number of variations may be made in the disclosed embodiments, all without departing from the scope of the invention, which is defined solely by the appended claims. It should be noted that although the features and elements are described in particular combinations, each feature or element can be used alone without other features and elements or in various combinations with or without other features and elements. The methods or flow charts provided may be implemented in a computer program, software, or firmware tangibly embodied in a computer-readable storage medium for execution by a general-purpose computer or processor.

The invention claimed is:

1. A thermophotovoltaic device comprising:
  a thermophotovoltaic absorber having a first side configured to receive electromagnetic radiation radiated from a thermal source and generate electricity from the received electromagnetic radiation; and
  a front window positioned on the first side of the thermophotovoltaic absorber such that electromagnetic radiation travels through the front window before reaching the first side of the thermophotovoltaic absorber, the front window comprising an outer front window layer and an inner front window layer positioned between the outer front window layer and the first side of the thermophotovoltaic absorber, wherein
the outer front window layer comprises a material having a first bandgap;
the inner front window layer comprises a material having a second bandgap;
the thermophotovoltaic absorber comprises a material having a third bandgap;
the first bandgap is the same as or larger than the second bandgap; and
the first bandgap and the second bandgap are both the same as or larger than the third bandgap.

2. The thermophotovoltaic device of claim 1, wherein the first bandgap is greater than 1 eV, the third bandgap is less than 1 eV, and the second bandgap is between the first bandgap and the third bandgap.

3. The thermophotovoltaic device of claim 1, further comprising an intermediate front window layer positioned between the outer front window layer and the inner front window layer, the intermediate front window layer having a bandgap between the first bandgap and the second bandgap.

4. The thermophotovoltaic device of claim 1, wherein:
the outer front window layer comprises a material having a first doping concentration;
the inner front window layer comprises a material having a second doping concentration; and
the first doping concentration is the same as or larger than the second doping concentration.

5. The thermophotovoltaic device of claim 4, wherein the inner front window layer is doped with Si, Te, Se, or S and the outer front window layer is doped with Si, Te, Se, or S.

6. The thermophotovoltaic device of claim 4, wherein the inner front window layer is doped to a concentration of between $5 \times 10^{16}$ cm$^{-3}$ and $5 \times 10^{18}$ cm$^{-3}$; and
the outer front window layer is doped to a concentration of between $2.5 \times 10^{18}$ cm$^{-3}$ and $5 \times 10^{19}$ cm$^{-3}$.

7. The thermophotovoltaic device of claim 6, wherein:
the outer front window layer further comprises a material having a first conduction band energy level and a first valence band energy level;
the inner front window layer comprises a material having a second conduction band energy level and a second valence band energy level;
the thermophotovoltaic absorber comprises a material having a third conduction band energy level and a third valence band energy level;
the first conduction band energy level is greater than the second conduction band energy level;
the second conduction band energy level is greater than the third conduction band energy level;
the first valence band energy level is less than the second valence band energy level; and
the second valence band energy level is less than the third valence band energy level.

8. The thermophotovoltaic device of claim 7, wherein:
the thermophotovoltaic absorber has an n-type doping;
the difference between the first conduction band energy level and the second conduction band energy level is less than 77 meV;
the difference between the second conduction band energy level and the third conduction band energy level is less than 77 meV;
the inner front window layer and the outer front window layer have n-type doping and are doped to a concentration of greater than $1 \times 10^{18}$ cm$^{-3}$; and
the difference between the first valence band energy level and the second valence band energy level and/or the difference between the second valence band energy level and the third valence band energy level is greater than 77 meV; such that
electrons move between and through the conduction bands of the outer front window layer, the inner front window layer, and the thermophotovoltaic absorber more freely than holes move between and through the valence bands of the outer front window layer, the inner front window layer, and the thermophotovoltaic absorber to form an electron-selective contact.

9. The thermophotovoltaic device of claim 7, wherein:
the thermophotovoltaic absorber has an p-type doping;
the difference between the first valence band energy level and the second valence band energy level is less than 77 meV;
the difference between the second valence band energy level and the third valence band energy level is less than 77 meV;
the inner front window layer and the outer front window layer have p-type doping and are doped to a concentration of greater than $1 \times 10^{18}$ cm$^{-3}$; and
the difference between the first conduction band energy level and the second conduction band energy level and/or the difference between the second conduction band energy level and the third conduction band energy level is greater than 77 meV; such that
holes move between and through the valence bands of the outer front window layer, the inner front window layer, and the thermophotovoltaic absorber more freely than electrons move between and through the conduction bands of the outer front window layer, the inner front window layer, and the thermophotovoltaic absorber to form a hole-selective contact.

10. The thermophotovoltaic device of claim 1, wherein the thermophotovoltaic absorber comprises a III/V semiconductor material.

11. The thermophotovoltaic device of claim 10, wherein the inner front window layer comprises a III/V semiconductor material and the outer front window layer comprises a III/V semiconductor material.

12. The thermophotovoltaic device of claim 11, wherein:
the thermophotovoltaic absorber comprises GaAs;
the inner front window layer comprises InGaP or AlGaAs; and
the outer front window layer comprises AlInP, AlInGaP, InGaP or AlGaAs.

13. The thermophotovoltaic device of claim 11, wherein:
the thermophotovoltaic absorber comprises InGaAs;
the inner front window layer comprises InP, GaAsSb, or InGaAsP; and
the outer front window layer comprises InP.

14. The thermophotovoltaic device of claim 11, wherein:
the thermophotovoltaic absorber comprises GaSb;
the inner front window layer comprises AlGaSb or AlAsSb; and
the outer front window layer comprises AlGaSb or AlAsSb.

15. A method of making a thermophotovoltaic device comprising:
depositing an outer front window layer;
depositing an inner front window layer; and
depositing a thermophotovoltaic absorber on the inner front window layer such that a first side of the thermophotovoltaic absorber contacts the inner front window layer and the inner front window layer is positioned is positioned between the thermophotovoltaic absorber and the outer front window layer; wherein the thermophotovoltaic absorber is configured to receive electromagnetic radiation radiated from a thermal source and generate electricity from the received electromagnetic radiation, and wherein the outer front window layer comprises a material having a first bandgap;

the inner front window layer comprises a material having a second bandgap;

the thermophotovoltaic absorber comprises a material having a third bandgap;

the first bandgap is the same as or larger than the second bandgap; and the first bandgap and the second bandgap are both the same as or larger than the third bandgap.

16. The method of claim 15, wherein:

depositing the outer front window layer comprises depositing a III/V semiconductor material having a bandgap of greater than 1 eV;

depositing the thermophotovoltaic absorber comprises depositing a III/V semiconductor material having a bandgap of less than 1 eV; and depositing the inner front window layer comprises depositing a III/V semiconductor material having a bandgap between the bandgap of the material of the outer front window layer and the bandgap of the material of the thermophotovoltaic absorber.

17. The method of claim 15, wherein:

depositing the outer front window layer comprises depositing a material having a first doping concentration;

depositing the inner front window layer comprises depositing a material having a second doping concentration; and the first doping concentration is the same as or larger than the second doping concentration.

18. The method of claim 17, wherein:

depositing the inner front window layer comprises depositing a III/V semiconductor material doped with Si, Te, Se, or S; and depositing the outer front window layer comprises depositing a III/V semiconductor material doped with Si, Te, Se, or S.

19. The method of claim 18, wherein:

depositing the thermophotovoltaic absorber comprises depositing GaAs;

depositing the inner front window layer comprises depositing InGaP or AlGaAs; and depositing the outer front window layer comprises depositing AlInP, AlInGaP, InGaP or AlGaAs.

20. The method of claim 18, wherein:

depositing the thermophotovoltaic absorber comprises depositing InGaAs;

depositing the inner front window layer comprises depositing InP, GaAsSb, or InGaAsP; and depositing the outer front window layer comprises depositing InP.

21. The method of claim 18, wherein:

depositing the thermophotovoltaic absorber comprises depositing GaSb;

depositing the inner front window layer comprises depositing AlGaSb or AlAsSb; and depositing the outer front window layer comprises depositing AlGaSb or AlAsSb.

22. The method of claim 15, wherein depositing the inner front window layer comprises depositing the inner front window layer onto the outer front window layer.

23. The method of claim 15, further comprising:

depositing a buffer layer onto a growth substrate; and depositing a release layer into the buffer layer; and wherein depositing the outer front window layer comprises depositing the outer front window layer onto the release layer.

* * * * *